United States Patent
Lee et al.

(10) Patent No.: US 7,527,743 B2
(45) Date of Patent: May 5, 2009

(54) APPARATUS AND METHOD FOR ETCHING INSULATING FILM

(75) Inventors: Seok Won Lee, Gyoungsangbok-Do (KR); Sang Min Jang, Gyeonggi-Do (KR); Sang Kyu Kim, Kyoungsangbok-Do (KR)

(73) Assignee: LG Display Co., Ltd., Seoul (KR)

( * ) Notice: Subject to any disclaimer, the term of this patent is extended or adjusted under 35 U.S.C. 154(b) by 246 days.

(21) Appl. No.: 10/650,962

(22) Filed: Aug. 29, 2003

(65) Prior Publication Data

US 2004/0074601 A1 Apr. 22, 2004

(30) Foreign Application Priority Data

Oct. 16, 2002 (KR) ............... 10-2002-0063214

(51) Int. Cl.
*C03C 15/00* (2006.01)
*B44C 1/22* (2006.01)

(52) U.S. Cl. .................. 216/88; 216/23; 216/83; 216/90; 134/2; 134/23; 134/24; 156/345.11

(58) Field of Classification Search ............. 216/23, 216/83, 90; 134/2, 23, 24; 156/345.11
See application file for complete search history.

(56) References Cited

U.S. PATENT DOCUMENTS

| | | | |
|---|---|---|---|
| 3,978,580 A | 9/1976 | Leupp et al. | |
| 4,094,058 A | 6/1978 | Yasutake et al. | |
| 4,620,894 A * | 11/1986 | Gurian et al. | 156/345.21 |
| 4,653,864 A | 3/1987 | Baron et al. | |
| 4,691,995 A | 9/1987 | Yamazaki et al. | |
| 4,775,225 A | 10/1988 | Tsuboyama et al. | |
| 4,922,938 A * | 5/1990 | Siegmund et al. | 134/126 |
| 5,007,968 A * | 4/1991 | Coffman et al. | 134/25.4 |
| 5,242,540 A * | 9/1993 | Ishii et al. | 216/13 |
| 5,247,377 A | 9/1993 | Omeis et al. | |
| 5,263,888 A | 11/1993 | Ishihara et al. | |
| 5,379,139 A | 1/1995 | Sato et al. | |
| 5,406,989 A | 4/1995 | Abe | |
| 5,499,128 A | 3/1996 | Hasegawa et al. | |
| 5,507,323 A | 4/1996 | Abe | |
| 5,511,591 A | 4/1996 | Abe | |
| 5,539,545 A | 7/1996 | Shimizu et al. | |
| 5,548,429 A | 8/1996 | Tsujita | |
| 5,642,214 A | 6/1997 | Ishii et al. | |
| 5,658,441 A * | 8/1997 | Spain et al. | 204/203 |
| 5,680,189 A | 10/1997 | Shimizu et al. | |

(Continued)

FOREIGN PATENT DOCUMENTS

EP 1 003 066 5/2000

(Continued)

OTHER PUBLICATIONS

Office Action issued by the Korean Patent Office on Jun. 26, 2006.

*Primary Examiner*—Shamim Ahmed
(74) *Attorney, Agent, or Firm*—McKenna Long & Aldridge LLP

(57) ABSTRACT

An apparatus and a method for etching insulating film prevents generation of spots by spraying etchant on a lower surface of the substrate as well as the upper surface.

19 Claims, 7 Drawing Sheets

U.S. PATENT DOCUMENTS

| | | | |
|---|---|---|---|
| 5,742,370 A | 4/1998 | Kim et al. | |
| 5,757,451 A | 5/1998 | Miyazaki et al. | |
| 5,852,484 A | 12/1998 | Inoue et al. | |
| 5,854,664 A | 12/1998 | Inoue et al. | |
| 5,861,932 A | 1/1999 | Inata et al. | |
| 5,875,922 A | 3/1999 | Chastine et al. | |
| 5,952,676 A | 9/1999 | Sato et al. | |
| 5,956,112 A | 9/1999 | Fujimori et al. | |
| 5,964,952 A * | 10/1999 | Kunze-Concewitz | 134/2 |
| 6,001,203 A | 12/1999 | Yamada et al. | |
| 6,011,609 A | 1/2000 | Kato et al. | |
| 6,016,178 A | 1/2000 | Kataoka et al. | |
| 6,016,181 A | 1/2000 | Shimada | |
| 6,055,035 A | 4/2000 | von Gutfeld et al. | |
| 6,163,357 A | 12/2000 | Nakamura | |
| 6,219,126 B1 | 4/2001 | von Gutfeld | |
| 6,226,067 B1 | 5/2001 | Nishiguchi et al. | |
| 6,236,445 B1 | 5/2001 | Foschaar et al. | |
| 6,304,306 B1 | 10/2001 | Shiomi et al. | |
| 6,304,311 B1 | 10/2001 | Egami et al. | |
| 6,337,730 B1 | 1/2002 | Ozaki et al. | |
| 6,414,733 B1 | 7/2002 | Ishikawa et al. | |
| 6,541,389 B1 * | 4/2003 | Kubo et al. | 438/745 |
| 6,652,731 B2 * | 11/2003 | Cobley et al. | 205/296 |
| 6,702,202 B1 * | 3/2004 | Boyd et al. | 239/225.1 |
| 6,806,031 B2 * | 10/2004 | Endo et al. | 430/278.1 |
| 2001/0002100 A1 | 5/2001 | Compton et al. | |
| 2001/0021000 A1 | 9/2001 | Egami | |
| 2002/0100745 A1 * | 8/2002 | Knotter et al. | 216/84 |
| 2003/0000555 A1 * | 1/2003 | Ko | 134/122 R |
| 2005/0227888 A1 * | 10/2005 | Verhaverbeke et al. | 510/175 |

FOREIGN PATENT DOCUMENTS

| | | |
|---|---|---|
| JP | 51-065656 | 6/1976 |
| JP | 57-038414 | 3/1982 |
| JP | 57-088428 | 6/1982 |
| JP | 58-027126 | 2/1983 |
| JP | 59-057221 | 4/1984 |
| JP | 59-195222 | 11/1984 |
| JP | 60-111221 | 6/1985 |
| JP | 60-164723 | 8/1985 |
| JP | 60-217343 | 10/1985 |
| JP | 61-007822 | 1/1986 |
| JP | 61-055625 | 3/1986 |
| JP | 62-089025 | 4/1987 |
| JP | 62-090622 | 4/1987 |
| JP | 62-205319 | 9/1987 |
| JP | 63-109413 | 5/1988 |
| JP | 63-110425 | 5/1988 |
| JP | 63-128315 | 5/1988 |
| JP | 63-311233 | 12/1988 |
| JP | 04-48090 * | 2/1992 |
| JP | 05-127179 | 5/1993 |
| JP | 05-154923 | 6/1993 |
| JP | 05-265011 | 10/1993 |
| JP | 05-281557 | 10/1993 |
| JP | 05-281562 | 10/1993 |
| JP | 06-051256 | 2/1994 |
| JP | 06-148657 | 5/1994 |
| JP | 06-160871 | 6/1994 |
| JP | 06-235925 | 8/1994 |
| JP | 06-265915 | 9/1994 |
| JP | 06-313870 | 11/1994 |
| JP | 07-084268 | 3/1995 |
| JP | 07-128674 | 5/1995 |
| JP | 07-181507 | 7/1995 |
| JP | 08-095066 | 4/1996 |
| JP | 08-101395 | 4/1996 |
| JP | 08-106101 | 4/1996 |
| JP | 08-171094 | 7/1996 |
| JP | 08-190099 | 7/1996 |
| JP | 08-240807 | 9/1996 |
| JP | 09-005762 | 1/1997 |
| JP | 09-026578 | 1/1997 |
| JP | 09-061829 | 3/1997 |
| JP | 09-073075 | 3/1997 |
| JP | 09-073096 | 3/1997 |
| JP | 09-127528 | 5/1997 |
| JP | 09-230357 | 9/1997 |
| JP | 09-281511 | 10/1997 |
| JP | 09-311340 | 12/1997 |
| JP | 10-79371 | 3/1998 |
| JP | 10-123537 | 5/1998 |
| JP | 10-123538 | 5/1998 |
| JP | 10-142616 | 5/1998 |
| JP | 10-177178 | 6/1998 |
| JP | 10-221700 | 8/1998 |
| JP | 10-282512 | 10/1998 |
| JP | 10-333157 | 12/1998 |
| JP | 10-333159 | 12/1998 |
| JP | 11-014953 | 1/1999 |
| JP | 11-038424 | 2/1999 |
| JP | 11-064811 | 3/1999 |
| JP | 11-109388 | 4/1999 |
| JP | 11-133438 | 5/1999 |
| JP | 11-142864 | 5/1999 |
| JP | 11-174477 | 7/1999 |
| JP | 11-212045 | 8/1999 |
| JP | 11-248930 | 9/1999 |
| JP | 11-326922 | 11/1999 |
| JP | 11-344714 | 12/1999 |
| JP | 2000-002879 | 1/2000 |
| JP | 2000-029035 | 1/2000 |
| JP | 2000-056311 | 2/2000 |
| JP | 2000-066165 | 3/2000 |
| JP | 2000-137235 | 5/2000 |
| JP | 2000-147528 | 5/2000 |
| JP | 2000-193988 | 7/2000 |
| JP | 2000-241824 | 9/2000 |
| JP | 2000-284295 | 10/2000 |
| JP | 2000-292799 | 10/2000 |
| JP | 2000-310759 | 11/2000 |
| JP | 2000-310784 | 11/2000 |
| JP | 2000-338501 | 12/2000 |
| JP | 2001-005401 | 1/2001 |
| JP | 2001-005405 | 1/2001 |
| JP | 2001-013506 | 1/2001 |
| JP | 2001-033793 | 2/2001 |
| JP | 2001-042341 | 2/2001 |
| JP | 2001-051284 | 2/2001 |
| JP | 2000-066615 | 3/2001 |
| JP | 2001-091727 | 4/2001 |
| JP | 2001-117105 | 4/2001 |
| JP | 2001-117109 | 4/2001 |
| JP | 2001-133745 | 5/2001 |
| JP | 2001-133794 | 5/2001 |
| JP | 2001-133799 | 5/2001 |
| JP | 2001-142074 | 5/2001 |
| JP | 2001-147437 | 5/2001 |
| JP | 2001-154211 | 6/2001 |
| JP | 2001-166272 | 6/2001 |
| JP | 2001-166310 | 6/2001 |
| JP | 2001-183683 | 7/2001 |
| JP | 2001-201750 | 7/2001 |
| JP | 2001-209052 | 8/2001 |
| JP | 2001-209060 | 8/2001 |
| JP | 2001-215459 | 8/2001 |
| JP | 2001-222017 | 8/2001 |
| JP | 2001-235758 | 8/2001 |
| JP | 2001-255542 | 9/2001 |
| JP | 2001-264782 | 9/2001 |
| JP | 2001-272640 | 10/2001 |
| JP | 2001-281675 | 10/2001 |

| | | | | | | |
|---|---|---|---|---|---|---|
| JP | 2001-281678 | 10/2001 | | JP | 2002-090759 | 3/2002 |
| JP | 2001-282126 | 10/2001 | | JP | 2002-090760 | 3/2002 |
| JP | 2001-305563 | 10/2001 | | JP | 2002-107740 | 4/2002 |
| JP | 2001-330837 | 11/2001 | | JP | 2002-122872 | 4/2002 |
| JP | 2001-330840 | 11/2001 | | JP | 2002-122873 | 4/2002 |
| JP | 2001-356353 | 12/2001 | | JP | 2002-139734 | 5/2002 |
| JP | 2001356354 | 12/2001 | | JP | 2002-202512 | 7/2002 |
| JP | 2002-014360 | 1/2002 | | JP | 2002-202514 | 7/2002 |
| JP | 2002-023176 | 1/2002 | | JP | 2002-214626 | 7/2002 |
| JP | 2002-049045 | 2/2002 | | KP | 20000035302 | 6/2000 |
| JP | 2002-082340 | 3/2002 | | | | |

* cited by examiner

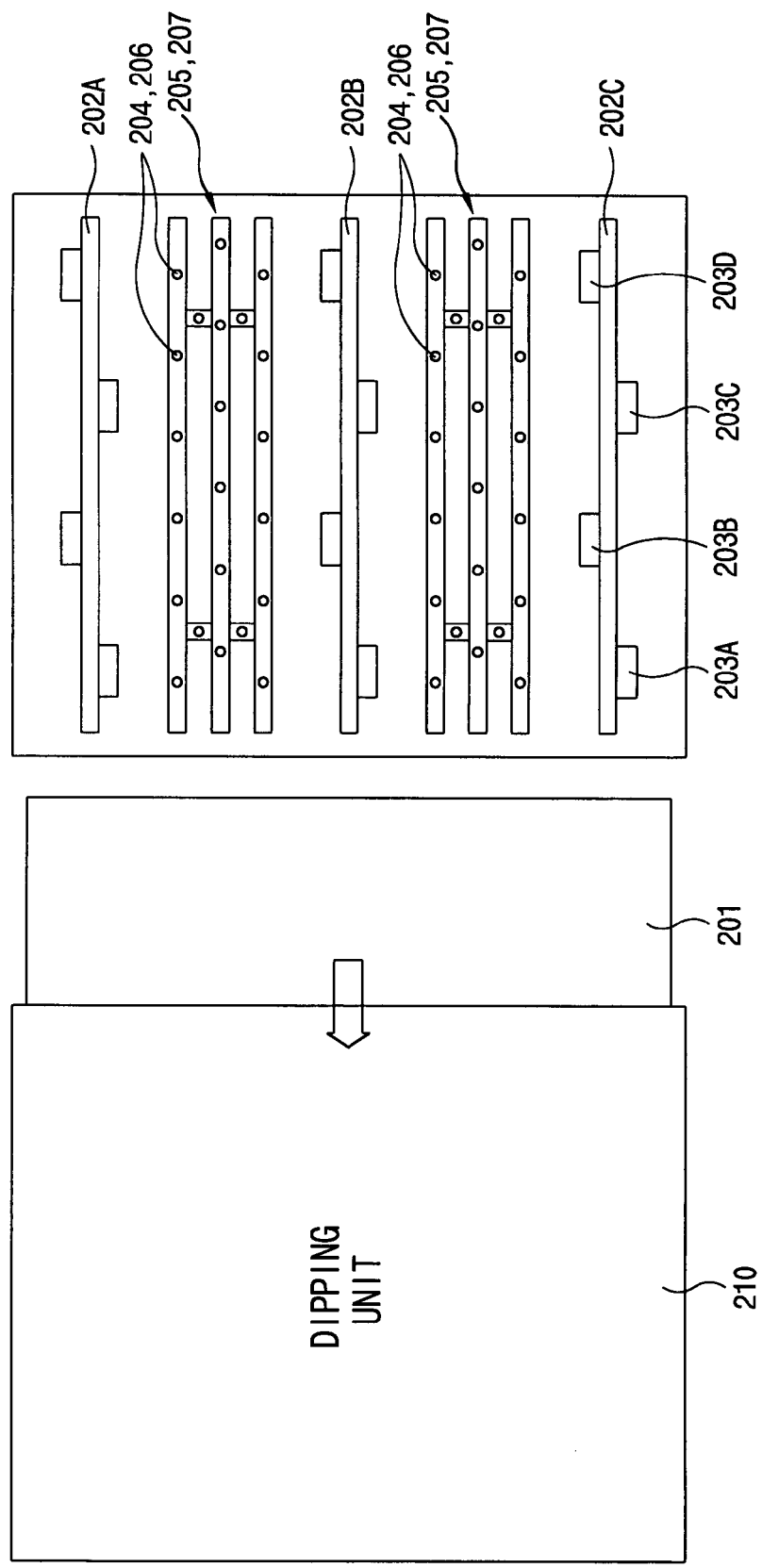

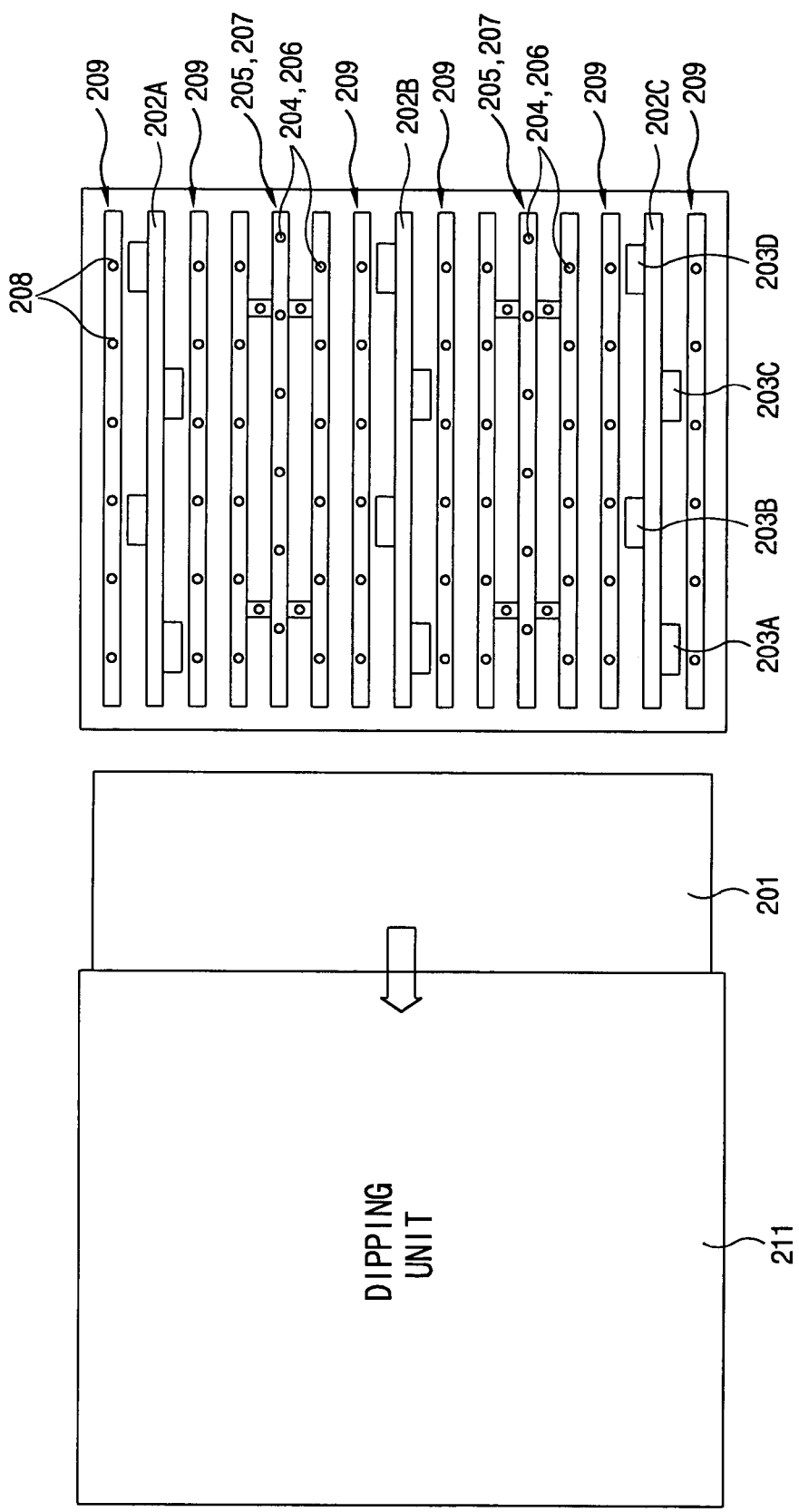

APPARATUS AND METHOD FOR ETCHING INSULATING FILM

This application claims the benefit of the Korean Application No. P2002-063214 filed on Oct. 16, 2002, which is hereby incorporated by reference for all purposes as if fully set forth herein.

BACKGROUND OF THE INVENTION

1. Field of the Invention

The present invention relates to an apparatus and a method for etching an insulating film and, more particularly, to an apparatus and a method for etching an insulating film formed on a thin film transistor array substrate of a liquid crystal display panel.

2. Discussion of the Related Art

Generally, liquid crystal display (LCD) devices include a LCD panel having a plurality of liquid crystal cells (e.g., unit pixels) arranged in a matrix pattern and a driver integrated circuit (IC) for driving the plurality of liquid crystal cells. Upon driving, the driver IC applies data signals to predetermined ones of the liquid crystal cells, wherein the data signals control light transmittance characteristics of respective ones of the liquid crystal cells to thereby display images.

LCD panels typically include a color filter substrate, a thin film transistor (TFT) array substrate opposing the color filter substrate, and a layer of liquid crystal material formed between the two substrates. The TFT array substrate supports a plurality of gate lines capable of transmitting scan signals supplied from a gate driver IC to the liquid crystal cells and a plurality of data lines capable of transmitting data signals supplied from a data driver IC to the liquid crystal cells. The plurality of data lines are substantially perpendicular to the plurality of gate lines, TFTs are formed at crossings of the gate and data lines, and the liquid crystal cells are defined by the crossings of the gate and data lines.

The gate driver IC sequentially supplies the scan signals to the plurality of gate lines such that the liquid crystal cells are sequentially selected one horizontal line at a time. The data driver IC individually supplies the data signals to selected ones of the liquid crystal cells.

A plurality of pixel electrodes and a common electrode are formed on inner side surfaces of the TFT array substrate and the color filter substrate, respectively, and applying electric fields to the liquid crystal layer. The plurality of pixel electrodes are formed within respective ones of the liquid crystal cells on the TFT array substrate while the common electrode is formed over the entire surface of the color filter substrate. Light transmittance characteristics of individual liquid crystal cells is selectively controlled by controlling the voltage applied to predetermined ones of the pixel electrodes while applying a voltage to the common electrode. To control the voltage applied to predetermined ones of the pixel electrodes, TFTs are used as switching devices connected to corresponding ones of the gate lines, data lines, and pixel electrodes to selectively apply voltages to pixel electrodes.

FIG. 1 illustrates a liquid crystal cell of a related art LCD device.

Referring to FIG. 1, a plurality of gate lines 4-1 and 4 extend along a first direction on a substrate and are separated from each other by a predetermined distance and a plurality of data lines 2 and 2+1 extend along a second direction, substantially perpendicular to the first direction, and are separated from each other on by a predetermined distance. Accordingly, crossings of the plurality of gate lines 4-1 and 4 and data lines 2 and 2+1 generate a regular matrix pattern, wherein liquid crystal cells are defined by the crossings of the gate and data lines 2 and 4, respectively, and wherein TFTs are provided at crossings of the gate and data lines 2 and 4, respectively, and are connected to pixel electrodes 14.

Each TFT includes a gate electrode 10 protruding from a portion of the gate line 4, a source electrode 8 protruding from a portion of the data line 2 and overlapping with the gate electrode 10, and a drain electrode 12 spaced apart from the source electrode 8 by a predetermined distance. The drain electrode 12 is formed with the source electrode electrically connected to a corresponding pixel electrode 14 through a drain contact hole 16. The pixel electrode 14 is generally formed of conductive materials having high light transmittance characteristics such as indium tin oxide (ITO). The TFT is further provided with a semiconductor layer (not shown) that provides a conductive channel between the source electrode 8 and the drain electrode 12 when a scan signal supplied to the gate electrode 10 via the gate line 4. When a scan signal is supplied to the gate electrode 10, the conductive channel transmits a data signal, supplied to the source electrode 8 via the data line 4, to the drain electrode 12 wherein the drain electrode 12 applies the data signal to the pixel electrode 14 via through the drain contact hole 16. Applied to the pixel electrode 14, and together with a common electrode formed on a color filter substrate (not shown), the data signal generates an electric field within a liquid crystal layer having a dielectric anisotropy. Upon generation of the electric field, liquid crystal molecules within the liquid crystal layer rotate to transmit light. The degree to which light is transmitted by the liquid crystal cell is controlled by a voltage value of the data signal applied to the pixel electrode 14.

Further, a gate insulating film (not shown) is formed over the gate lines 4 and 4-1 and the pixel electrode 14 and is connected to a storage electrode 20 through a storage contact hole 22. The storage electrode 20 overlaps with the preceding gate line 4-1 and separated from the preceding gate line 4-1 by the gate insulating film and thus functions as a storage capacitor 18 that sustains the driving of the liquid crystal cell by supplying a charged voltage during a period when the TFT turned off, after a voltage value of a scan signal is charged to the gate line 4 during a period when the TFT is turned on when the scan signal is applied.

FIG. 2 illustrates a cross-sectional view of the liquid crystal cell shown in FIG. 1, taken along section line I-I'.

Referring to FIG. 2, the liquid crystal cell includes a color filter substrate 60 attached to and facing the TFT array substrate 50, a spacer 70 for uniformly maintaining a distance between the TFT array substrate 50 and the color filter substrate 60, and a liquid crystal layer 80 formed within the space between the TFT array substrate 50 and the color filter substrate 60.

The process of fabricating the TFT will now be described in greater detail with reference to FIG. 2.

The gate electrode 10 and gate line 4 (not shown) are formed by providing a metal layer (e.g., Mo, Al, or Cr) on the TFT array substrate 50 and patterning the metal layer. Insulating material is then deposited over the entire surface of the TFT array substrate 50 and the gate electrode 10 to form a gate insulating film 30. A semiconductor layer 32 (e.g., amorphous silicon) and an ohmic contact layer 34 doped with a high concentration of phosphorus (P) (e.g., n$^+$ amorphous silicon) are sequentially deposited and patterned to form an active layer 36. The source electrode 8 and the drain electrode 12 are then formed by depositing a metal layer on the gate insulating film 30 and the ohmic contact layer 34 and patterning the deposited metal layer such that the source electrode 8 is spaced apart from the drain electrode 12 by a predetermined distance over the active layer 36. Upon patterning to form the source and drain electrodes 8 and 12, a portion of the ohmic contact layer 34 becomes exposed and, subsequently, the exposed portion of the ohmic contact layer 34 is removed. As the ohmic contact layer 34 is removed, a portion of the semiconductor layer 32 becomes exposed. The exposed portion of the semiconductor layer 32 is the channel region of the TFT.

A passivation film 38 is then formed by depositing insulating material over the entire surface of the gate insulating film 30, the source electrode 8, the drain electrode 12, and the channel region of the TFT. A drain contact hole 16 for exposing a portion of the drain electrode 12 is then formed by selectively etching the passivation film 38 over the drain electrode 12. A pixel electrode 14 is then formed by depositing and patterning a transparent metal material on the passivation film 38 and electrically contacts the drain electrode 12 through the drain contact hole 16.

An alignment layer 51 is then formed over the entire surface of the TFT array substrate 50 including the passivation film 38 and the pixel electrode 14. After forming the alignment layer 51 a rubbing process is performed wherein the rubbing process provides an initial alignment direction to the subsequently provided liquid crystal layer. The rubbing process generates a plurality of parallel grooves on the surface of the alignment layer 51 that are capable of determining an orientation of a polymer chain within the liquid crystal layer. The rubbing process is performed by applying a rubbing a cloth to the surface of the alignment layer 51 at a uniform pressure and speed.

The process of fabricating the storage capacitor region will now be described in greater detail with reference to FIG. 2.

Simultaneously with the formation of the gate electrode 10 and gate line 4 described above, a gate line 4-1 is formed over the TFT array substrate 50 followed by the formation of the gate insulating film 30. Simultaneously with the formation of the source and drain electrodes 8 and 12, a storage electrode 20 is then patterned over the gate insulating film 30, wherein the storage electrode 20, separated from the gate line 4-1 by the gate insulating film 30 and overlapping the gate line 4-1, functions as a storage capacitor 18.

After forming the passivation film 38, a storage contact hole 22 is formed simultaneously with the formation of the drain contact hole 16 by etching a portion of the passivation film 38 to expose a portion of the storage electrode 20. Upon patterning of the aforementioned pixel electrode 14, a portion of the pixel electrode 14 becomes electrically connected to the storage electrode 20 through the storage contact hole 22.

The process of fabricating the color filter substrate 60 will now be described in greater detail with reference to FIG. 2.

A black matrix layer 62 is deposited over the entire surface of the color filter substrate 60 to form openings spaced apart from each other at a predetermined interval. Next, color filters 63 corresponding to red (R), green (G), and blue (B) colors are formed within the openings defined by the black matrix layer 62. A common electrode 64 is then formed over the entire surface of the color filter 63 and the black matrix layer 62 by depositing and patterning a metal layer.

An alignment layer 65 is then formed over the entire surface of the color filter substrate 60 including common electrode 64 and a rubbing process, similar to the rubbing process described above, is performed.

After the TFT array substrate 50 and color filter substrate 60 are fabricated, sealant material (not shown) is printed onto the TFT array substrate 50 (or color filter substrate 60) and spacers 70 are formed on the color filter substrate 60 (or TFT array substrate 50). The spacers 70 are formed according to a scattering method wherein glass beads, plastic beads, etc., having a predetermined diameter are uniformly scattered over the surface of the substrate. After the sealant material is printed and the spacers 70 are formed on the TFT array and color filter substrates, the two substrates are attached to each other and cut into unit LCD panels. Upon cutting the attached substrates, the device yield of the aforementioned fabrication process is improved and the a plurality of LCD panels are simultaneously formed from attached substrates having a large area.

As described above, the related art LCD device is fabricated by separately preparing TFT array substrates 50 and color filter substrates 60 in parallel processes, attaching the TFT array and color filter substrates 50 and 60 to each other, and cutting the TFT array and color filter substrates 50 and 60 into unit LCD panels. Further, the distance between the attached TFT array and color filter substrates 50 and 60 must be kept substantially uniform via the spacers 70. Still further, in forming individual devices such as the thin film transistor TFT and the storage capacitor 18 on the thin film transistor array substrate 50, an insulating film is deposited, contact holes are patterned within the insulating film via selective etching processes, and a metal layer is deposited and patterned within the contact holes.

A related art apparatus for etching the aforementioned insulating film will now be described in greater detail with reference to FIGS. 3 and 4.

FIG. 3 illustrates a side view of a related art etching apparatus.

Referring to FIG. 3, the related art etching apparatus for etching the insulating film includes a supporting bar 102 for supporting a substrate 101 (e.g., a glass substrate) having an insulating film formed thereon, rotatable rollers 103A-103D formed on the supporting bar 102 for moving the substrate 101 along a lateral direction, and a spray nozzle 105 for spraying etchant (HF) through nozzle holes 104A-104C onto the upper surface of the substrate 101 moving along the lateral direction.

FIG. 4 illustrates a top view of the related art etching apparatus shown in FIG. 3.

Referring to FIG. 4, the related art apparatus for etching the insulating film includes supporting bars 102A-102C, for supporting the substrate 101 having the insulating film formed thereon, provided at center and side surfaces of the substrate 101, rotatable rollers 103A-103D formed at first side surfaces of each of the supporting bars 102A-102C for moving the substrate 101 along the lateral direction.

When the substrate 101, having the insulating film formed thereon, is loaded onto the related art etching apparatus shown in FIGS. 3 and 4, the supporting bars 102A-102C support the substrate 101 while the rotatable rollers 103A-103D move the substrate 101 along the lateral direction. Further, etchant is sprayed through the nozzle holes 104A-104C of the spray nozzle 105 onto the surface of the insulating film, thereby etching the insulating film formed on the upper surface of the substrate 101.

Upon etching the insulating film using the related art etching apparatus, however, the etching byproducts become attached to the lower surface of the substrate 101 wherein the etching byproducts deleteriously generate spots. Further, the etchant disadvantageously etches the lower surface of the substrate 101. Still further, the substrate 101, supported by the supporting bars 102A-102C becomes unbalanced between the first side and a second side, opposing the first side, of the supporting bars 102A-102C since the rotatable rollers 103A-103D are positioned only at first sides of the supporting bars 102A-102C. Accordingly, portions of the substrate 101 droop between the supporting bars 102A-102C wherein the etchant collects on the drooping portions of the substrate 101, causing non-uniform etching of the substrate 101.

Further, since the rotatable rollers 103A-103D are positioned only at the first sides of the supporting bars 102A-102C, contact surfaces of the substrate 101 (i.e., portions of the surface of the substrate 101 contacting the rotatable rollers 103A-103D) become excessively large, thereby generating spots (e.g., roller marks) on the substrate 101.

In view of the above, the related art etching apparatus and method for etching the insulating film are disadvantageous due to a degradation of picture quality of the LCD device upon generation of spots on the substrate.

SUMMARY OF THE INVENTION

Accordingly, the present invention is directed to apparatus and method for etching an insulating film that substantially obviates one or more of the problems due to limitations and disadvantages of the related art.

An advantage of the present invention provides an apparatus and a method for etching insulating film capable of preventing the generation of spots on a substrate caused by etching the insulating film.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, an apparatus for etching insulating film may, for example, include at least one supporting bar for supporting a substrate having an insulating film, the substrate including upper and lower surfaces, a plurality of rollers positioned on the at least one supporting bar, the plurality of rollers for moving the substrate along a lateral direction, an upper spray nozzle for spraying etchant onto the upper surface of the substrate, and a lower spray nozzle for spraying etchant onto the lower surface of the substrate.

In another aspect of the present invention, a method for etching an insulating film may, for example, include loading a substrate supporting an insulating film form, the substrate including upper and lower surfaces; spraying etchant onto the upper and lower surfaces of the substrate; and moving the substrate along a lateral direction.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 8 illustrates a top view of an etching apparatus in accordance with a third aspect of the present invention; and FIG. 9 illustrates a top view of an etching apparatus in accordance with a fourth aspect of the present invention.

DETAILED DESCRIPTION OF THE ILLUSTRATED EMBODIMENTS

Reference will now be made in detail to an embodiment of the present invention, example of which is illustrated in the accompanying drawings.

Figure 1:
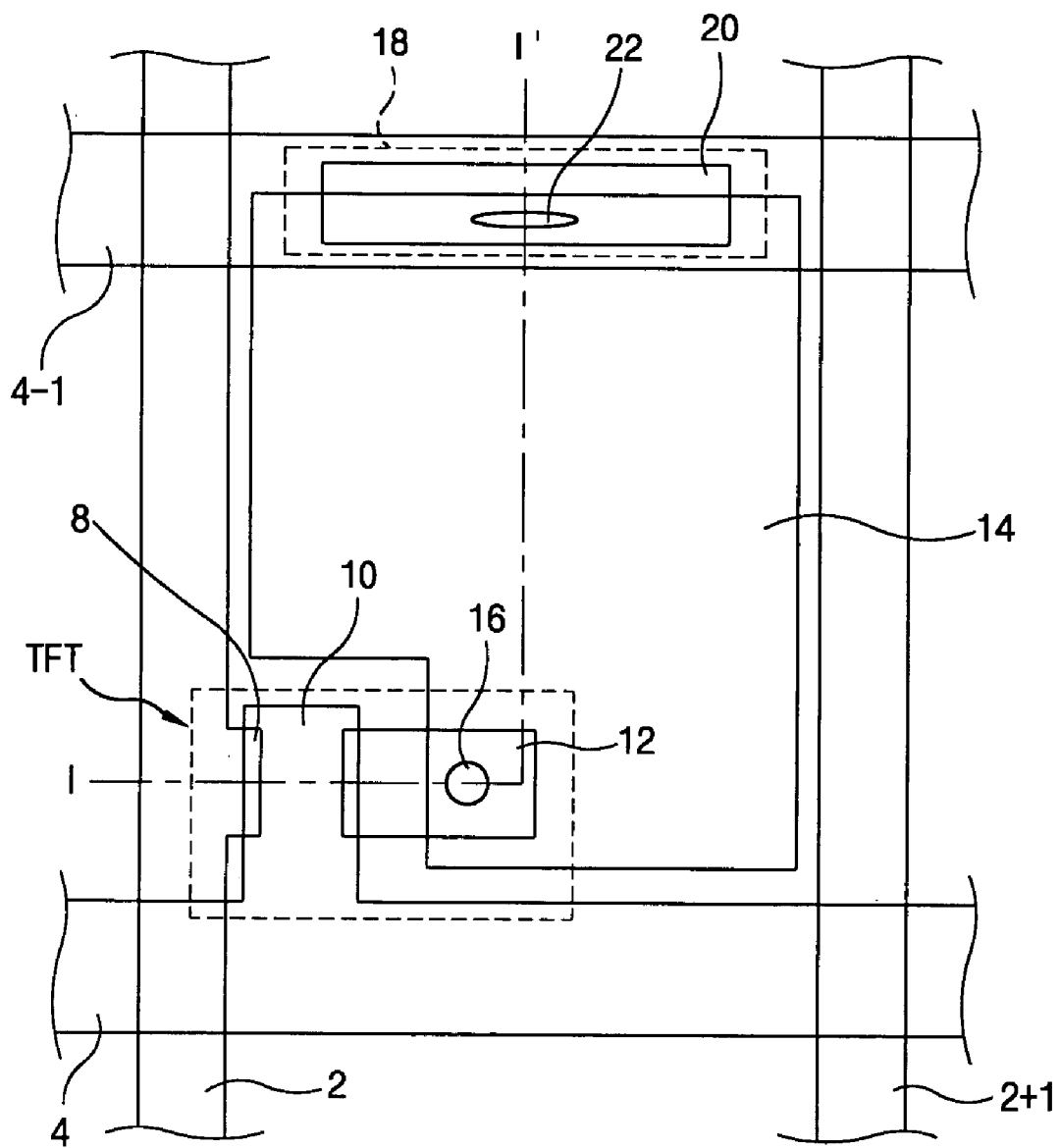
FIG. 1 illustrates a liquid crystal cell of a related art LCD device.
Figure 2:
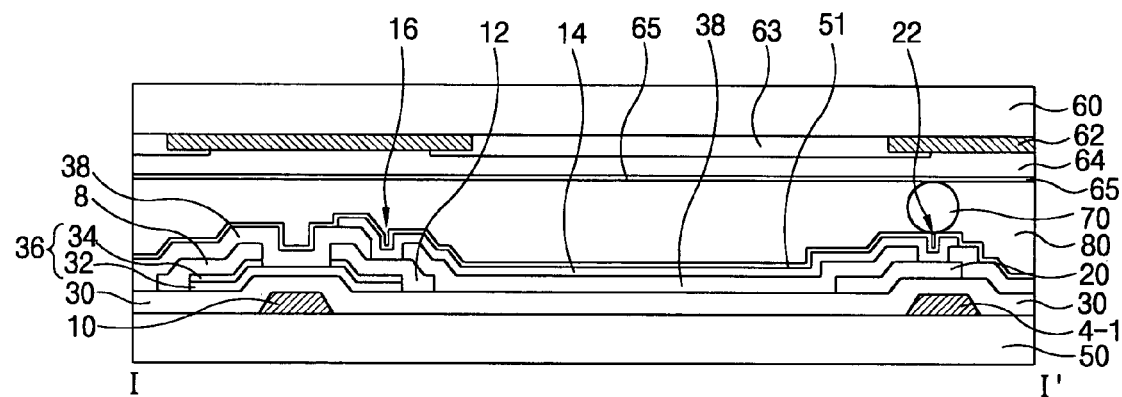
FIG. 2 illustrates a cross-sectional view of the liquid crystal cell shown in FIG. 1, taken along section line I-I'.
Figure 3:
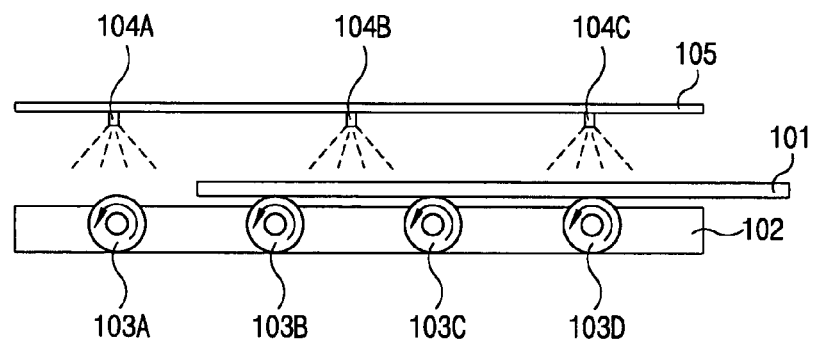
FIG. 3 illustrates a side view of a related art etching apparatus.
Figure 4:
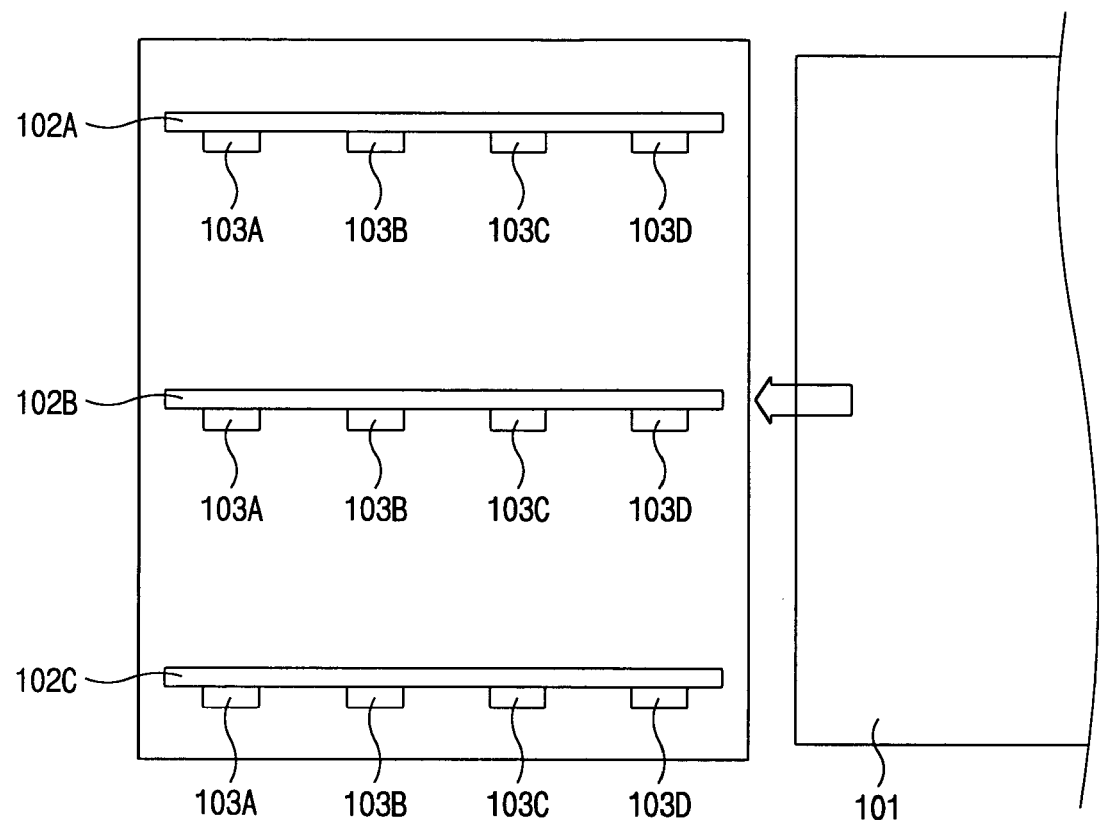
FIG. 4 illustrates a top view of the related art etching apparatus shown in FIG. 3.
Figure 5:
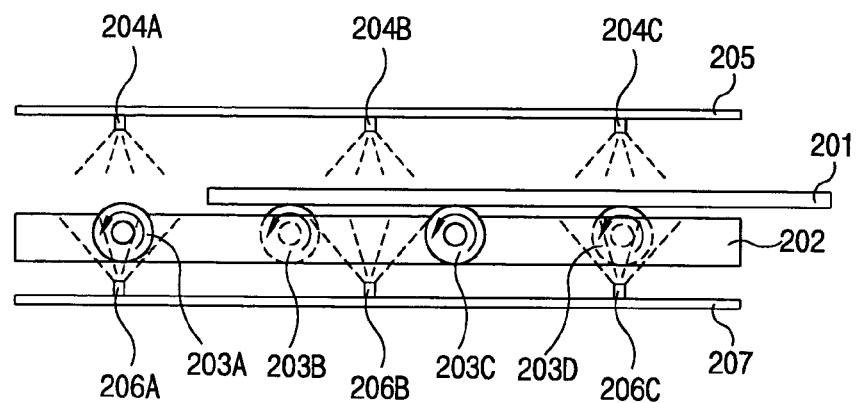
FIG. 5 illustrates a side view of an etching apparatus in accordance with a first aspect of the present invention.

FIG. 5 illustrates a side view of an etching apparatus in accordance with a first aspect of the present invention.

Referring to FIG. 5, an etching apparatus for etching an insulating film in accordance with the first aspect of the present invention may, for example include a supporting bar 202 for supporting a substrate 201 having an insulating film formed thereon, rollers 203A-203D which positioned on sides of the supporting bar 202 and may rotate to move the substrate 201 along a lateral direction, an upper spray nozzle 205 for spraying etchant onto the upper surface of the substrate 201, wherein the upper spray nozzle 205 may include upper nozzle holes 204A-204C through which the etchant is sprayable, and a lower spray nozzle 207 for spraying etchant onto the lower surface of the substrate 201, wherein the lower spray nozzle 207 may include lower nozzle holes 206A-206C through which the etchant is sprayable.

The etching apparatus in accordance with the first aspect of the present invention may prevent generation of spots on the substrate 201 since etching byproducts, generated as a result of etching the insulating film, are attached to the lower surface of the substrate 201 by spraying etchant onto the upper and lower surfaces of the substrate 201 when etching the insulating film formed on the upper surface of the substrate 201. For example, an insulating film including silicon oxide, silicon nitride, or combinations thereof, may be formed on the upper surface of the substrate 201 and an etchant including HF or $NH_4F$ may etch the insulating film and the lower surface of the substrate 201. However, and in accordance with the principles of the present invention, the etching apparatus may prevent generation of spots by uniformly etching the lower surface of the substrate 201. Accordingly, by spraying etchant onto the upper and lower surfaces of the substrate 201, the generation of spots may be prevented since etching byproducts of the insulting film attached on the lower surface of the substrate 201 may be removed.

Figure 6:
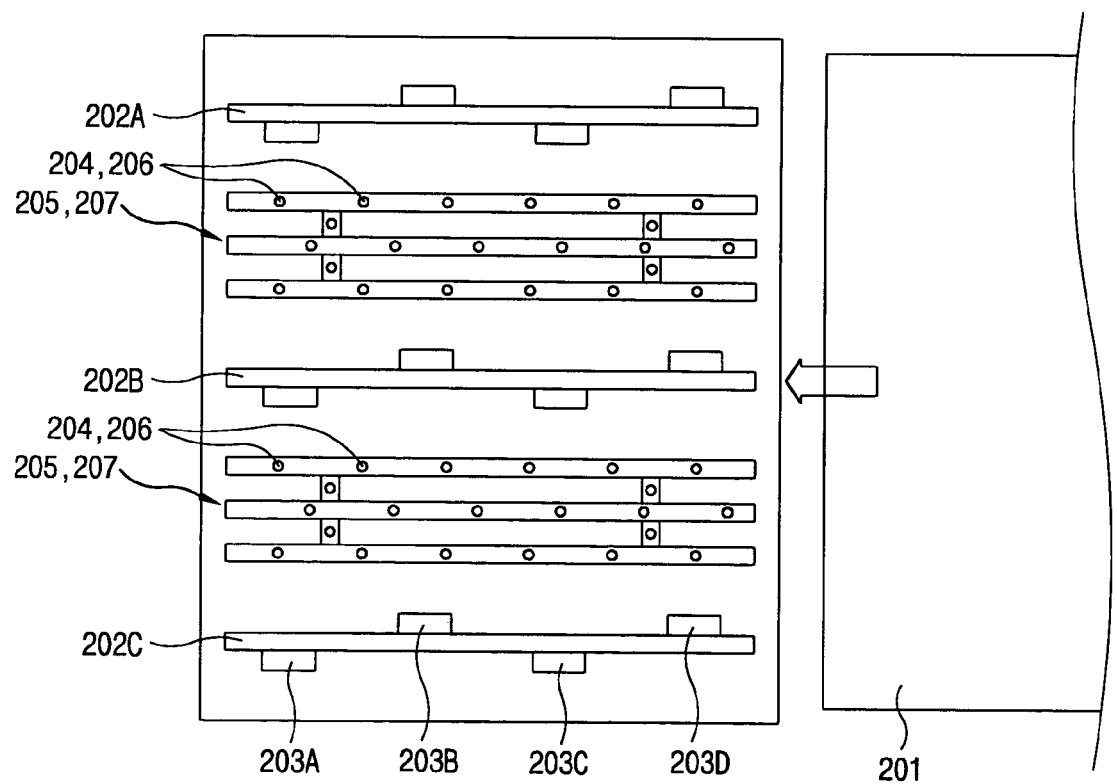
FIG. 6 illustrates a top view of an etching apparatus in accordance with the first aspect of the present invention.

FIG. 6 illustrates a top view of an etching apparatus in accordance with the first aspect of the present invention.

Referring to FIG. 6, the etching apparatus may, for example, include a plurality of supporting bars 202A-202C for supporting a substrate 201 on which an insulating film is formed. The supporting bars 202A-202C may be disposed at positions corresponding to the center and sides of the substrate 201. Rollers 203A and 203C may be positioned on first sides of the supporting bars 202A-202C while rollers 203B and 203D may be positioned on second sides of the supporting bars 202A-202C.

In accordance with the first aspect of the present invention, the etching apparatus may include a lower spray nozzle 207 for spraying etchant onto the lower surface of the substrate 201 via the lower nozzle holes 206 and an upper spray nozzle 205 (shown in FIG. 6 overlapping the lower spray nozzle 207) for spraying etchant onto the upper surface of the substrate 201 via upper nozzle holes 204.

Since rollers 203A-203D are alternately positioned on the both first and second sides of each of the respective supporting bars 202A-202C, the substrate 201 may be completely supported by the supporting bars 202A-202C may be balanced between both sides of the supporting bars 202A-202C. Accordingly, the substrate 201 may be prevented from drooping between the supporting bars 202A-202C. Therefore, the etchant may be prevented from collecting within any drooping regions of the substrate 201 and non-uniform etching of the substrate 201 may be substantially prevented.

Further, since rollers 203A-203D are alternately positioned on both first and second sides of the supporting bars 202A-202C, the contact surfaces of the substrate (i.e., the portions of the substrate 201 that contact the rollers 203A-203D) may be distributed and the generation of roller marks on the substrate 201 may be reduced. In one aspect of the present invention, the rollers 203A-203D may be include a water repellent or hydrophobic material (silicon resin, silicon rubber, etc.) to even further reduce the generation of the roller marks.

In accordance with the principles of the aforementioned first aspect of the present invention, an insulating film formed on the substrate 201 may be etched by loading the substrate 201 having the insulating film formed thereon, supporting the substrate 201 with the supporting bars 202A-202C, spraying etchant onto the upper and lower surfaces of the substrate 201 via the upper and lower spray nozzles 205 and 207, and moving the substrate 201 along a lateral direction using the rollers 203A-203D. In one aspect of the present invention, the substrate 201 may be moved along the lateral direction while the etchant is sprayed onto the upper and lower surfaces.

Figure 7:
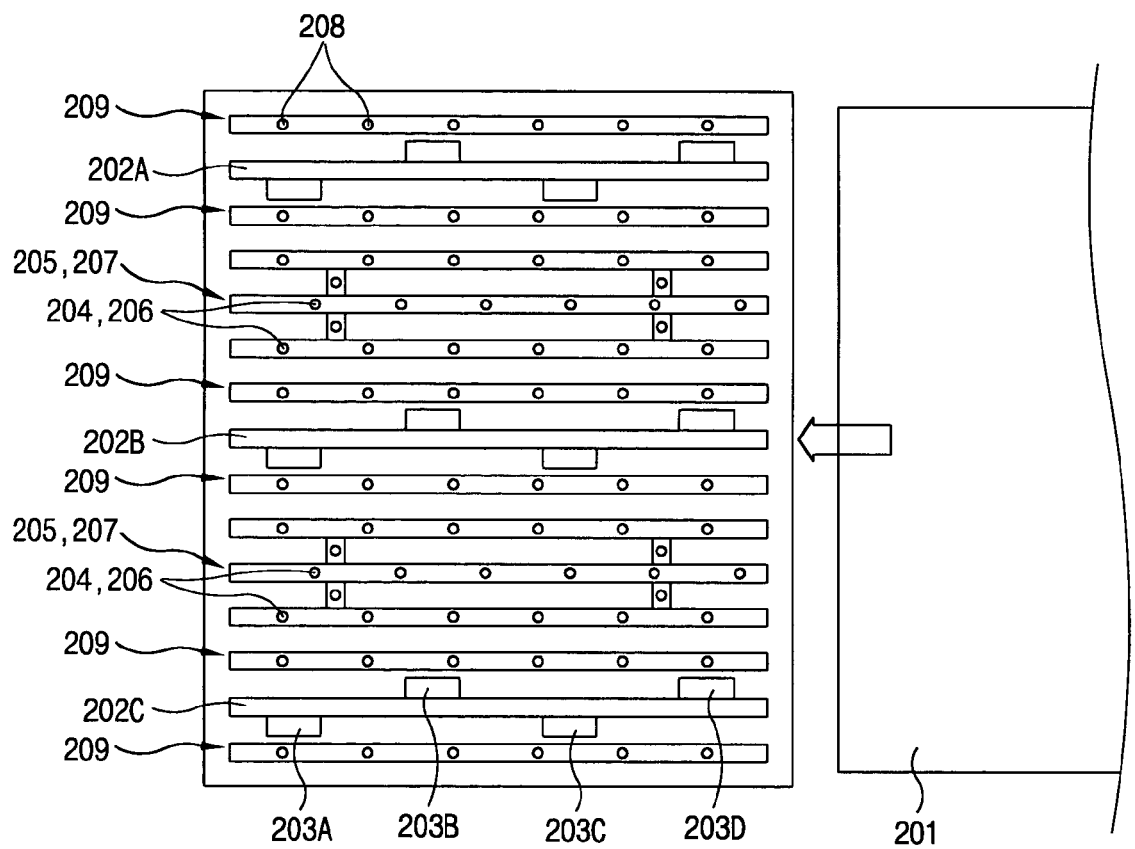
FIG. 7 illustrates a top view of an etching apparatus in accordance with a second aspect of the present invention.

FIG. 7 illustrates a top view of an etching apparatus in accordance with a second aspect of the present invention.

Referring to FIG. 7, the etching apparatus may, for example, be constructed substantially identically to the etching apparatus shown in FIGS. 5 and 6, and may further include roller contact surface spray nozzles 209 for spraying etchant onto the aforementioned contact surfaces of the substrate 201 via roller nozzle holes 208. In accordance with the second aspect of the present invention, generation of roller marks on the contact surfaces of the substrate 201 can be reduced by providing the roller contact surface spray nozzles 209 to the etching apparatus of the first aspect of the present invention.

In accordance with the principles of the aforementioned second aspect of the present invention, an insulating film formed on the substrate 201 may be etched by loading the substrate 201 having the insulating film formed thereon, supporting the substrate 201 with the supporting bars 202A-202C, spraying the etchant onto the upper surface, the lower surface, and the contact surfaces via the upper spray nozzles 205, the lower spray nozzles 207, and the roller contact surface spray nozzles 209, respectively, and moving the substrate 201 along the lateral direction using the rotary rollers 203A-203D. In one aspect of the present invention, the substrate 201 may be moved along the lateral direction while the etchant is sprayed onto the upper and lower surfaces.

FIG. 8 illustrates a top view of an etching apparatus in accordance with a third aspect of the present invention.

Referring to FIG. 8, the etching apparatus may, for example, be constructed substantially identically to the etching apparatus shown in FIGS. 5 and 6, and may further include a dipping unit 210 for dipping the substrate 201 having the insulating film etched by etchant sprayed through the upper spray nozzles 205 and the lower spray nozzles 207. In the present aspect of the present invention, the dipping unit 210 may contain an etchant for removing spots on the substrate 201. In accordance with the third aspect of the present invention, spots that were not removed by the aforementioned etching apparatus of the first aspect of the present invention may be completely removed.

In accordance with the aforementioned third aspect of the present invention, the insulating film formed on the substrate 201 may be etched by loading the substrate 201 having an insulating film formed thereon, supporting the substrate 201 with the supporting bars 202A-202C, spraying the etchant onto the upper and lower surfaces of the substrate 201 via the upper and lower spray nozzles 205 and 207, moving the substrate 201 along a lateral direction using the rotary rollers 203A-203D, and dipping the substrate 201 having the insulating film etched by the sprayed etchant into an etchant contained by the dipping unit 210. In one aspect of the present invention, the substrate 201 may be moved along the lateral direction while the etchant is sprayed onto the upper and lower surfaces.

FIG. 9 illustrates a top view of an etching apparatus in accordance with a fourth aspect of the present invention.

Referring to FIG. 9, the etching apparatus may, for example, be constructed substantially identically to the etching apparatus shown in FIG. 7 and may further include a dipping unit 211 for dipping the substrate 201 having the insulated film etched by etchant sprayed through the upper spray nozzles 205, the lower spray nozzles 207, and the roller contact surface spray nozzles 209. In the present aspect of the present invention, the dipping unit 211 may contain an etchant for removing spots on the substrate 201. In accordance with the fourth aspect of the present invention, spots that were not removed by the aforementioned etching apparatus of the second aspect of the present invention may be completely removed.

In accordance with the aforementioned fourth aspect of the present invention, the insulating film formed on the substrate may be etched by loading the substrate 201 having an insulating film formed thereon, supporting the substrate 201 with the supporting bars 202A-202C, spraying the etchant onto the upper surface, the lower surface, and the contact surfaces via the upper spray nozzles 205, the lower spray nozzles 207, and the roller contact surface spray nozzles 209, respectively, moving the substrate 201 along a lateral direction using the rotary rollers 203A-203D, and dipping the substrate 201 having the insulating film etched by the sprayed etchant into an etchant contained by the dipping unit 211. In one aspect of the present invention, the substrate 201 may be moved along the lateral direction while the etchant is sprayed onto the upper and lower surfaces.

According to the principles of the fourth aspect of the present invention, the substrate 201 may be provided as a TFT array substrate. Further, no spots may be generated upon etching the TFT array substrate 201 for about 16 minutes.

According to the principles of the present invention, the etching apparatus and method for etching the insulating film may improve a picture quality of LCD devices by minimizing the generation of spots on the lower surface of the substrate introduced during the etching of an insulating film.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for etching an insulating film, comprising:
   loading a substrate supporting an insulating film on a supporting bar, the substrate including upper and lower surfaces;
   spraying etchant onto the upper and lower surfaces of the substrate; and
   moving the substrate along a lateral direction,
   wherein moving the substrate includes providing a plurality of rollers in contact with the lower surface of the substrate and rotating the plurality of rollers, the rollers are arranged at the both sides of the supporting bar under the substrate and the rollers at one side of the supporting bar are alternately disposed to the rollers at other side of the supporting bar along the lateral direction so that a plurality of rollers are contacted with the lower surface of the substrate in the zigzag form; and
   wherein spraying etchant includes spraying the etchant to the contact portions of the substrate contacted with the surface of the plurality of rollers by a surface spray nozzle.

2. The method of claim 1, further comprising moving the substrate along the lateral direction while the etchant is sprayed onto the upper and lower surfaces.

3. The method of claim 1, wherein the substrate includes a thin film transistor array substrate.

4. The method of claim 1, wherein the insulating film includes silicon oxide.

5. The method of claim 1, wherein the insulating film includes silicon nitride.

6. The method of claim 1, wherein the insulating film includes silicon oxide and silicon nitride.

7. The method of claim 1, wherein the etchant includes HF.

8. The method of claim 1, wherein the etchant includes $NH_4F$.

9. The method of claim 1, wherein the spraying includes spraying the upper surface of the substrate with an upper spray nozzle.

10. The method of claim 9, wherein the upper spray nozzle includes a plurality of upper nozzle holes through which the etchant is sprayable.

11. The method of claim 1, wherein the spraying includes spraying the lower surface of the substrate with a lower spray nozzle.

12. The method of claim 11, wherein the lower spray nozzle includes a plurality of lower nozzle holes through which the etchant is sprayable.

13. The method of claim 1, further comprising dipping the substrate into an etchant.

14. A method for etching an insulating film, comprising:
   loading a substrate supporting an insulating film, the substrate including upper and lower surfaces;
   supporting the substrate with at least one supporting bar;
   moving the substrate along a lateral direction with a plurality of rollers positioned along a length of a respective supporting bar, the rollers being arranged at the both sides of the supporting bar under the substrate and contacting a portion of the surface of the substrate; and
   spraying etchant onto the upper surface, the lower surface, and the contact portions of the substrate contacted by the plurality of rollers,
   wherein the rollers at one side of the supporting bar are alternately disposed to the rollers at other side of the supporting bar so that a plurality of rollers are contacted with the lower surface of the substrate in the zigzag form.

15. The method of claim 14, further comprising moving the substrate along the lateral direction while the etchant is sprayed onto the upper surface, the lower surface, and the portions of the substrate contactable by the plurality of rollers.

16. The method of claim 14, wherein the spraying includes spraying the upper surface of the substrate with an upper spray nozzle.

17. The method of claim 14, wherein the spraying includes spraying the lower surface of the substrate with a lower spray nozzle.

18. The method of claim 14, wherein the spraying includes spraying the portions of the substrate contactable by the plurality of rollers with a roller contact surface spray nozzle.

19. The method of claim 14, further comprising dipping the substrate into an etchant.

* * * * *